Jan. 5, 1971 SHINICHI NAKASHIMA ET AL 3,553,539

MICROWAVE-OSCILLATING DEVICE AND THE METHOD OF MAKING SAME

Filed Nov. 15, 1968

SHINICHI NAKASHIMA,
MASUMI TAKESHIMA and
YUKIO MIYAI,

INVENTORS

BY Wenderoth, Lind & Ponack
ATTORNEYS 3,553,539

MICROWAVE-OSCILLATING DEVICE AND THE METHOD OF MAKING SAME

Shinichi Nakashima, Suita, Masumi Takeshima, Takatsuki, and Yukio Miyai, Osaka, Japan, assignors to Matsushita Electronics Corporation, Kadoma, Osaka Prefecture, Japan Filed Nov. 15, 1968, Ser. No. 776,214
Claims priority, application Japan, Nov. 22, 1967, 42/75,584
Int. Cl. H01l 5/02
U.S. Cl. 317—234 4 Claims

ABSTRACT OF THE DISCLOSURE

A planar type microwave-oscillating semiconductor diode having a PN junction in a semiconductor substrate. The PN junction has the shape of a spherical surface extending into the substrate at its center to a depth $d$ which is at least one fourth of the radius $r$ at the surface of said substrate. Such a semiconductor diode has increased oscillation frequency and output power. The diode can be made by forming a diffusion preventing mask on a germanium substrate of a certain type of electric conductivity having an impurity concentration ranging from $1\times10^{14}$ to $1\times10^{18}$ atoms/cm.$^3$, and by deeply diffusing through a small diffusion hole in said mask an impurity which will make the conductivity opposite to that of said substrate.

Figure 1:
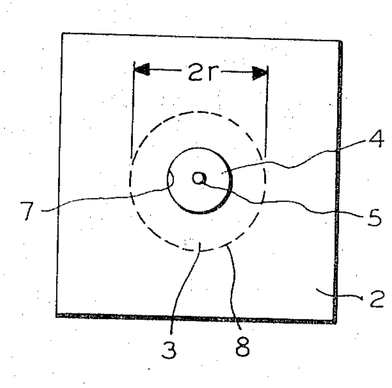

This invention relates to a microwave-oscillating device. More particularly, this invention relates to a microwave-oscillating device constituted by a semiconductor diode capable of oscillating at a higher frequency and with larger output power than conventional semiconductor diode type microwave-oscillating devices.

It is well known that oscillation in an extremely high frequency range, e.g. in a millimeter wave length range, occurs when a reverse voltage in the range of the break-down voltage is applied to a PN junction of a certain kind of diode made of silicon, germanium or gallium arsenide, and which semiconductor diode is mounted in a suitable cavity resonator. On the other hand there are well known methods for making such PN junction diodes, such as the diffusion method, the alloy method and the epitaxial growth method, and also well known types of diodes such as the mesa type and the planar type. Hitherto, the mesa type diodes have generally been employed as oscillation devices. In a diode of the mesa type, the PN junction is almost flat, and therefore the oscillation frequency thereof is determined largely by the characteristic of reverse break-down voltage applied to the PN junction, and changes somewhat due to the diode current and the conditions in the external resonance circuit. That is to say, the threshold frequency of the diode is determined by the reverse break-down voltage impressed on this diode, and in general, the lower the break-down voltage, the higher the threshold frequency. For example, a mesa type germanium diode having a break-down voltage of 50 volts had a threshold frequency of 2 gigahertz ($2\times10^9$ hertz), while another such diode having a break-down voltage of 20 volts had a threshold frequency of 5 gigahertz.

In said conventional devices, oscillations at frequencies higher than the threshold frequencies can be produced by increasing the diode current or by varying the circuit constants of the external resonance circuit to suitable values. Frequency changes on the order of several gigahertz can be produced by changing the circuit constants of the external resonance circuit, for example by sliding a short-plunger of a cavity resonator. On the other hand, although the frequency can be extended to a higher frequency range by increasing the current, this increases power dissipation, and thus its use is restricted.

Applicants have discovered that a planar type diode having a break-down voltage as high as that of a mesa type diode has a higher threshold frequency of microwave oscillation than a mesa type diode. For example, a planar type germanium diode with a 10 volt reverse break-down voltage has a threshold frequency as high as 40 gigahertz, while a mesa type germanium diode with the same break-down voltage has a threshold frequency of only 20 gigahertz. In spite of these merits of the planar type diode, i.e. a high threshold frequency and simplicity of structure with respect to leads from the electrodes and external connections, as compared with the mesa type diodes, the conventional planar type diode has had the drawback that at extreme high frequency it has a small output power. In other words, the conventional planar diode does not increase its output power sufficiently with a rise of the reverse current, but instead the output power decreases at very high frequencies. In the conventional planar type diodes, unlike mesa type diodes, the PN junction is not formed in a plane due to the fabrication process by the well known diffusion method, and hence an edge part, i.e., a part having a small radius of curvature, is formed at said PN junction. This is believed to have some relation to the break-down at the edge part—known as the edge-break-down phenomenon—which occurs when a reverse electric field is impressed on said edge part.

In general, a diode for extremely high frequency oscillation has a negative resistance to reverse current of an amount in a range less than a certain limit, which current is produced by impressing reverse voltage exceeding the break-down voltage on the diode. During this time, the capacity of said diode rapidly decreases toward zero in accordance with the increase of said current within said range of reverse current. This phenomenon acts to raise said oscillation frequency as well as the output power. However, in a planar diode in which local break-down occurs, the capacity of the part of the PN junction where no break-down occurs acts as though it was connected in parallel with the oscillating element. Actually, therefore, the capacity decrease due to said current increase is not as much as might otherwise be expected. Consequently, the absolute value of the negative quality of said junction in an equivalent circuit increases. This increase is thought not only to lower the efficiency of oscillation, but also to decrease the oscillation output, owing to the fact that the oscillation frequency nears the cut-off frequency when it reaches a certain extremely high frequency range as the current increases.

One object of this invention is to overcome the above-mentioned problems concerning the performance of a planar type semiconductor diode microwave-oscillating device.

By the present invention, the extreme high frequency output is greatly increased by increasing the distance from the surface of the substrate to the PN junction.

Figure 2:
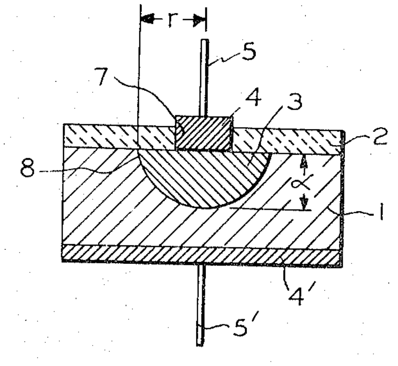

The construction, performance, other objects and features of this invention are set forth in greater detail in the following specification with reference to the accompanying drawings, in which:

FIG. 1 is a plan view of a microwave-oscillating device embodying the present invention; and FIG. 2 is a sectional side elevation view of the device shown in FIG. 1 taken along a vertical plane including the center of the device.

As shown in the figures, the device of the present invention is made by applying a diffusion preventive mask 2 of, for instance, silicon dioxide ($SiO_2$) or silicon nitride ($Si_3N_4$) to the surface of a semiconductor substrate 1 of P type semiconductor material having a surface impurity concentration of from $1\times10^{14}$ to $1\times10^{18}$ atoms/cm.$^3$, and then opening a small hole in said diffusion preventive mask, for example, by a photolithographic process. An impurity is then diffused from said hole in the mask 2 into the semiconductor substrate 1 so as to form a region 3 of N type conductivity, and thus to form PN junction 8 between the P type substrate 1 and the N type region 3. In the device thus manufactured, if the distance $d$ from the surface to the bottom of the junction is small enough, an edge part having a small radius of curvature is formed near the surface of the junction, but if said distance is made large enough, the shape of the junction is roughly in the shape of part of a spherical surface as shown in the drawings. The center of the hole in the mask can be regarded as a diffusion source point. It has been experimentally proven that if $d$ is larger than one fourth of radius $r$ of the junction at the surface of the substrate, the diode is useful for an oscillation device, and if $d$ is larger than $r/2$, the efficiency of this diode becomes 10 times as high as that where $d=r/4$, which approximates the theoretical value. In addition, by employing said construction the efficiency of oscillation rises and, consequently, stable microwave oscillation is produced with a diode composed of a semiconductor body having an impurity concentration of less than $1\times10^{15}$ atoms/cm.$^3$ which has hitherto been considered unfeasible. Experiments have even proved that the microwave oscillation produced by a diode having an impurity concentration as low as $1\times10^{14}$ atoms/cm.$^3$ is possible. In the construction of the planar type diode embodying the present invention, in order to make $d$ larger than $r/4$, the distance from the surface of the substrate to the junction must be larger than the diameter of said hole. It is known that from the theoretical standpoint if the distance from the surface to the junction is more than ten times the diameter of said hole, the junction can be considered to form part of the surface of a sphere. Actually, however, when manufacturing a semiconductor diode having a limited impurity concentration or limited diffusion conditions, and especially a limited surface concentration of impurities, it is very difficult to make the distance to said junction, for instance, more than 100 microns, when using a hole 10 microns in diameter.

According to the present invention, in order to solve the above-mentioned problem, the following method of manufacturing the semiconductor elements is employed. First, a hole is made in the diffusion preventing mask which is sufficiently small to produce the desired distance $d$ to the junction of the semiconductor element, and then a diffusion treatment is carried out. Then, in order to facilitate connection of a lead to the electrode, a hole having larger diameter than said previously formed diffusion hole is formed with the diffusion hole as a center in order to connect an electrode.

A specific example of carrying out the present invention comprises, as shown in FIGS. 1 and 2, first forming a film 2 of silicon dioxide ($SiO_2$) on a P type germanium substrate 1 having an impurity concentration of, for instance, $10^{16}$ atoms/cm.$^3$. Next, a round diffusion hole having a diameter of 2 microns is formed in said film 2. Through this diffusion hole antimony as an impurity is diffused to a depth of 20 microns to form N type diffused region 3 having surface density of roughly $10^{18}$ atoms/cm.$^3$ thus to form resultant PN junction 8. Then a hole 7 of diameter 30 microns is made in film 2 using the first-mentioned hole as a center, and an electrode 4 is placed therein and an external lead wire 5 is attached to electrode 4. Metal electrode 4' and lead wire 5' are also shown in FIG. 2. The specifications of this diode call for an output of about 100 milliwatts with a reverse breakdown voltage from 26 to 29 volts and oscillation in the X band (8.2 to 12 gigahertz).

In the present invention, the shape of the hole is not limited to a round hole but includes polygons (e.g., octagon, a ten sided hole, etc.) having obtuse angles, as long as the curvature of the junction in a plane at the surface of the substrate is less than the curvature of the junction when viewed in a cross sectional side view.

What is claimed is:

1. A semiconductor microwave oscillating device, comprising a substrate of one type of semiconductor material, a zone extending into the substrate having an impurity diffused into it to form another type of semiconductor material having a conductivity opposite that of the substrate, the surface of said zone which forms a PN junction between the materials being substantially hemispherical, the zone having a dimension from the substrate surface from which it extends and in a direction perpendicular to the surface which is larger than one fourth of the radius of the zone at the substrate surface, whereby when a reverse voltage exceeding the breakdown voltage is applied across the diode, it oscillates at a microwave frequency.

2. A semiconductor microwave oscillating device as claimed in claim 1 in which the substrate is germanium and has an impurity concentration of from $1\times10^{14}$ to $1\times10^{18}$ atoms/cm.$^3$.

3. A method of making a semiconductor microwave oscillating device comprising forming on a substrate of one kind of semiconductor material a diffusion preventing mask, making a small hole in said mask, diffusing an impurity through said hole into said substrate to form a zone of another kind of semiconductor material having a conductivity opposite that of the substrate, the surface of the zone which forms a PN junction between the materials being substantially hemispherical, the zone having a dimension from the substrate surface from which it extends and in a direction perpendicular to the surface of the substrate which is larger than one fourth of the radius of the zone at the substrate surface, whereby when a reverse voltage exceeding the breakdown voltage of the diode is impressed thereon, the diode oscillates at a microwave frequency.

4. A method as claimed in claim 3 further comprising the step of forming a larger hole than said firstmentioned hole in said mask using said firstmentioned hole as a center, and placing an electrode in said larger hole in contact with said zone.

References Cited

UNITED STATES PATENTS

| | | | |
|---|---|---|---|
| 3,165,430 | 1/1965 | Hugle | 317—234 |
| 3,387,189 | 6/1968 | Anderson et al. | 317—234 |

FOREIGN PATENTS

| | | | |
|---|---|---|---|
| 1,069,127 | 5/1967 | Great Britain | 317—234 |

JAMES D. KALLOW, Primary Examiner

U.S. Cl. X.R.

29—576